(12) United States Patent
Basceri et al.

(10) Patent No.: US 7,535,695 B2
(45) Date of Patent: May 19, 2009

(54) DRAM CELLS AND ELECTRONIC SYSTEMS

(75) Inventors: Cem Basceri, Boise, ID (US); Thomas M. Graettinger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/504,935

(22) Filed: Aug. 15, 2006

(65) Prior Publication Data

US 2006/0274477 A1 Dec. 7, 2006

Related U.S. Application Data

(63) Continuation of application No. 10/442,509, filed on May 20, 2003, now Pat. No. 7,092,234.

(51) Int. Cl.
*H01G 4/06* (2006.01)
*H01G 4/008* (2006.01)

(52) U.S. Cl. .................. 361/311; 361/305; 257/301

(58) Field of Classification Search .......... 361/301.1, 361/301.4, 303–305, 306.1, 311; 257/301, 257/303

See application file for complete search history.

(56) References Cited

U.S. PATENT DOCUMENTS

| | | | |
|---|---|---|---|
| 5,406,447 A * | 4/1995 | Miyazaki | 361/313 |
| 5,418,180 A | 5/1995 | Brown | |
| 5,792,693 A * | 8/1998 | Tseng | 438/254 |
| 5,874,770 A | 2/1999 | Saia et al. | |
| 6,111,319 A | 8/2000 | Liou et al. | |
| 6,150,226 A | 11/2000 | Reinberg | |
| 6,207,487 B1 | 3/2001 | Kim et al. | |
| 6,222,722 B1 | 4/2001 | Fukuzumi et al. | |
| 6,255,187 B1 | 7/2001 | Horii | |
| 6,255,687 B1 * | 7/2001 | Figura et al. | 257/309 |
| 6,314,028 B1 | 11/2001 | Kono | |
| 6,320,244 B1 | 11/2001 | Alers et al. | |
| 6,323,096 B1 | 11/2001 | Saia et al. | |
| 6,335,049 B1 | 1/2002 | Basceri | |
| 6,337,237 B1 | 1/2002 | Basceri et al. | |
| 6,346,454 B1 | 2/2002 | Sung et al. | |
| 6,350,685 B1 | 2/2002 | Asahina et al. | |
| 6,387,751 B2 | 5/2002 | Tominaga | |
| 6,446,317 B1 | 9/2002 | Figueroa et al. | |
| 6,451,646 B1 | 9/2002 | Lu et al. | |
| 6,452,776 B1 | 9/2002 | Chakravorty | |
| 6,476,432 B1 | 11/2002 | Basceri et al. | |
| 6,482,736 B1 | 11/2002 | Basceri et al. | |
| 6,486,022 B2 | 11/2002 | Lee | |
| 6,492,241 B1 | 12/2002 | Rhodes et al. | |
| 6,511,896 B2 | 1/2003 | Basceri et al. | |
| 6,534,357 B1 | 3/2003 | Basceri et al. | |
| 6,558,517 B2 | 5/2003 | Basceri | |
| 6,660,580 B2 | 12/2003 | Lee | |
| 6,660,660 B2 | 12/2003 | Haukka et al. | |

(Continued)

*Primary Examiner*—Eric Thomas
(74) *Attorney, Agent, or Firm*—Wells St. John P.S.

(57) ABSTRACT

The invention includes capacitor constructions which have a layer of aluminum oxide between a high-k dielectric material and a layer containing titanium and nitrogen. The layer containing titanium and nitrogen can be, for example, titanium nitride and/or boron-doped titanium nitride. The capacitor constructions can be incorporated into DRAM cells, which in turn can be incorporated into electronic systems. The invention also includes methods of forming capacitor constructions.

38 Claims, 3 Drawing Sheets

U.S. PATENT DOCUMENTS

| | | |
|---|---|---|
| 6,686,239 B2 | 2/2004 | Nam et al. |
| 6,753,618 B2 | 6/2004 | Basceri et al. |
| 6,780,704 B1 | 8/2004 | Raaijmakers et al. |
| 6,838,122 B2 | 1/2005 | Basceri et al. |
| 6,869,877 B2 | 3/2005 | Rhodes et al. |
| 6,881,642 B2 | 4/2005 | Basceri et al. |
| 6,893,963 B2 | 5/2005 | Chen |
| 6,900,106 B2 | 5/2005 | Basceri et al. |
| 6,940,112 B2 | 9/2005 | Rhodes et al. |
| 6,992,344 B2 | 1/2006 | Coolbaugh et al. |
| 7,011,978 B2 | 3/2006 | Basceri |
| 7,092,234 B2 * | 8/2006 | Basceri et al. .............. 361/311 |
| 2003/0017266 A1 | 1/2003 | Basceri et al. |
| 2003/0052358 A1 | 3/2003 | Weimer |
| 2003/0096473 A1 | 5/2003 | Shih et al. |
| 2003/0199139 A1 | 10/2003 | Lee |
| 2005/0073803 A1 * | 4/2005 | Cho ........................ 361/306.1 |

* cited by examiner

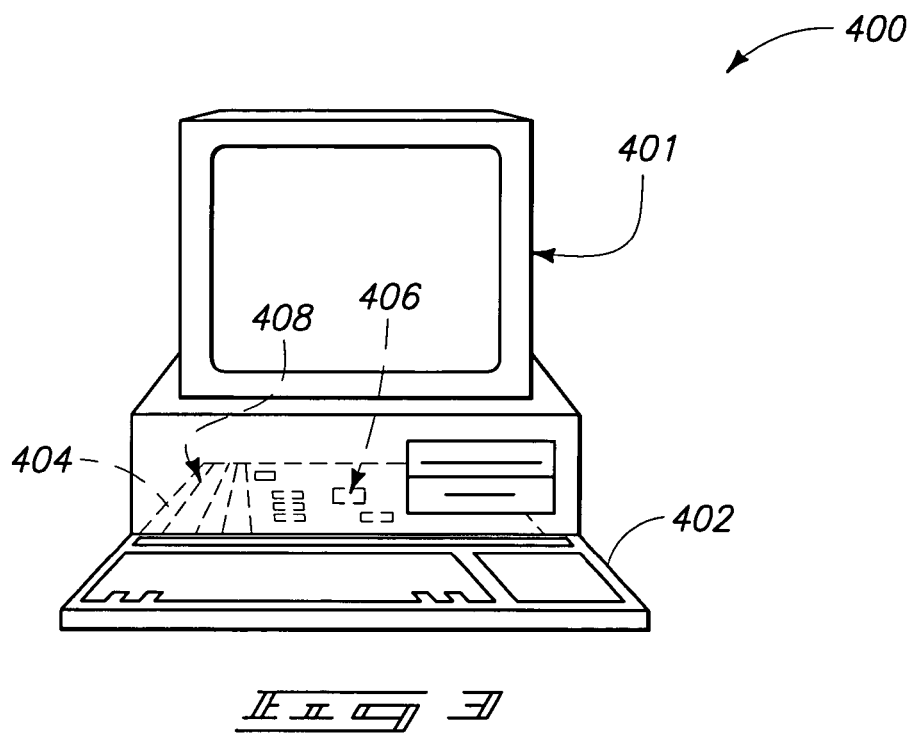
_Fig. 3_
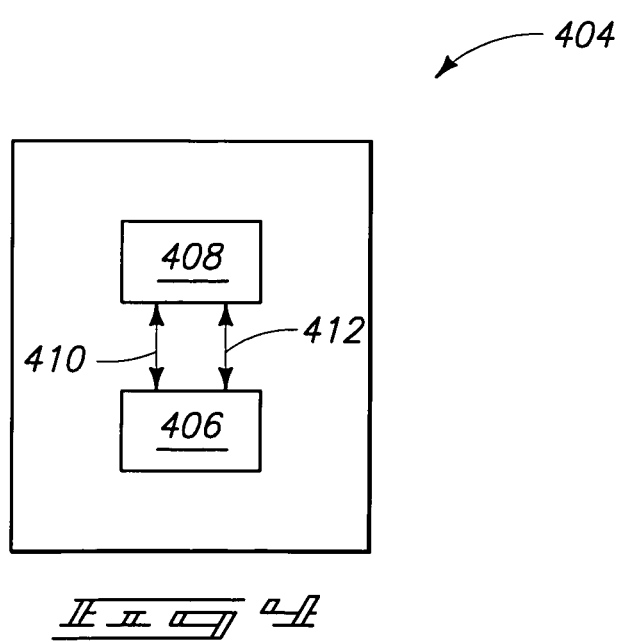
_Fig. 4_

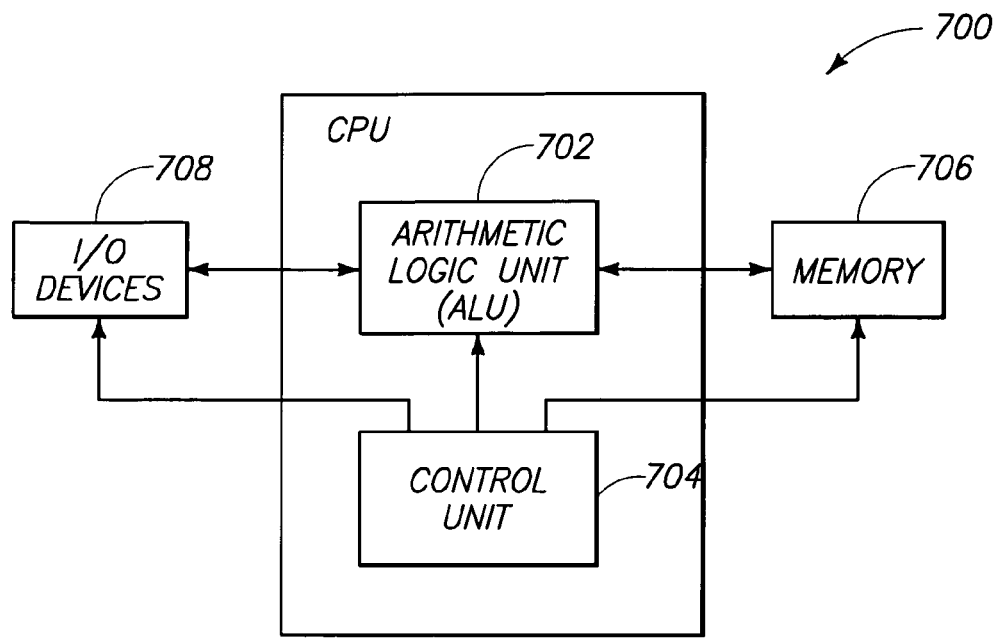
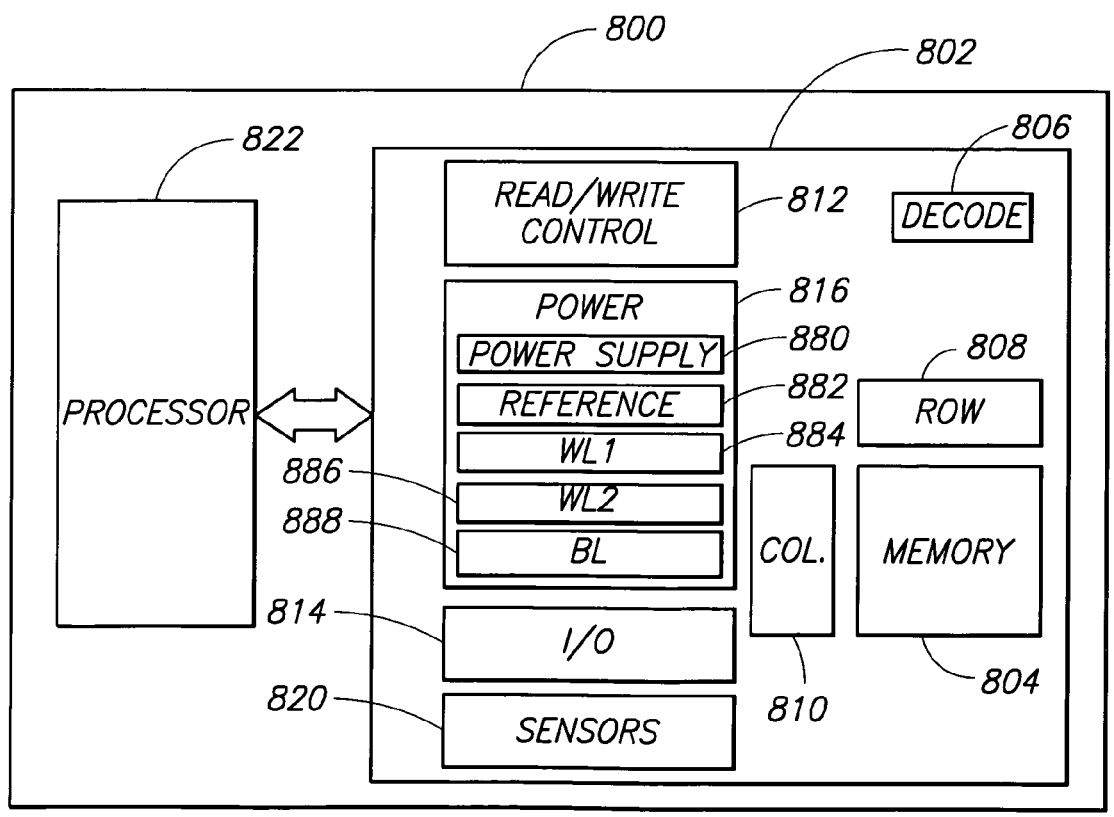

DRAM CELLS AND ELECTRONIC SYSTEMS

RELATED PATENT DATA

This patent application is a Continuation Application of U.S. patent application Ser. No. 10/442,509, now U.S. Pat. No. 7,092,234, filed May 20, 2003, entitled "Capacitor Constructions, and Methods of Forming Capacitor Constructions", naming Cem Basceri and Thomas M. Graettinger as inventors, the disclosure of which is hereby incorporated by reference.

TECHNICAL FIELD

The invention pertains to capacitor constructions and methods of forming capacitor constructions.

BACKGROUND OF THE INVENTION

Capacitor constructions are common circuit devices. Capacitor constructions are utilized in, for example, dynamic random access memory (DRAM) cells of integrated circuits. The DRAM cells typically comprise a charge storage capacitor coupled to an access device, with the typical access device being a metal-oxide-semiconductor field effect transistor (MOSFET).

A continuing goal in integrated circuit device fabrication is to increase performance of circuit devices without increasing the amount of real estate consumed by the devices. For capacitor devices, such goal can manifest as a desire to increase the total charge capacity of a capacitor device without significantly affecting the cell area consumed by the device. New capacitor dielectric materials with high dielectric constants (so-called high-k materials) have been introduced to replace conventional dielectric materials, such as, for example, silicon nitride and silicon dioxide. Thin films of the high-k materials can be utilized in capacitor devices to obtain high capacitance while maintaining, or even reducing, the footprint of the devices relative to previous devices that utilized lower k dielectric materials.

High-k dielectric materials are typically understood to be materials having a dielectric constant greater than that of silicon dioxide, with exemplary high-k materials being $Al_2O_3$ (aluminum oxide), $Ta_2O_5$ (tantalum pentoxide), barium titanate (BT), strontium titanate (ST), lead zirconate titanate (PZT), bismuth strontium titanate (BST), $HfO_x$ (hafnium oxide) and $ZrO_y$ (zirconium oxide). The x in $HfO_x$ and the y in $ZrO_y$ are numbers greater than zero, and typically less than or equal to 2.

Although the high-k dielectric materials described above can provide numerous advantages when utilized in capacitor constructions, there are difficulties associated with the materials which can offset the benefits gained by utilizing the materials. One problem encountered when incorporating high-k materials into current DRAM cell designs is that chemical reactivity between the high-k materials and other materials of a DRAM cell can impede performance of the cell, and even destroy operability of the cell. For instance, numerous of the high-k materials are formed under strongly oxidizing conditions, and such conditions can oxidize electrode components which are intended to be incorporated into capacitor constructions with the high-k materials. The oxidized electrode components can have reduced electrical conductivity relative to non-oxidized components, which can impair operability of the resulting capacitor cell, and in some cases can lower the total capacitance of resulting capacitor below acceptable tolerances.

It would be desirable to develop new methods for incorporating high-k dielectric materials into capacitor constructions.

SUMMARY OF THE INVENTION

In one aspect, the invention encompasses a capacitor construction which includes a first capacitor electrode having a layer comprising titanium and nitrogen. A layer comprising aluminum oxide is over the layer comprising titanium and nitrogen, and a high-k dielectric material other than aluminum oxide is over the layer comprising aluminum oxide. A second capacitor electrode is over the high-k dielectric material.

In another aspect, the invention encompasses a capacitor construction comprising a high-k dielectric material, two layers which include titanium and nitrogen, and two layers which include aluminum oxide. The high-k dielectric material is between the two layers which comprise aluminum oxide, and the two layers comprising aluminum oxide are in turn between the two layers comprising titanium and nitrogen.

In another aspect, the invention encompasses methods of forming capacitor constructions.

The capacitor constructions of the present invention can be incorporated into DRAM cells and electronic systems.

BRIEF DESCRIPTION OF THE DRAWINGS

Preferred embodiments of the invention are described below with reference to the following accompanying drawings.

FIG. 3 is a diagrammatic view of a computer illustrating an exemplary application of the present invention.

FIG. 4 is a block diagram showing particular features of the motherboard of the FIG. 3 computer.

FIG. 5 is a high-level block diagram of an electronic system according to an exemplary aspect of the present invention.

FIG. 6 is a simplified block diagram of an exemplary electronic system according to an aspect of the present invention.

DETAILED DESCRIPTION OF THE PREFERRED EMBODIMENTS

Figure 1:
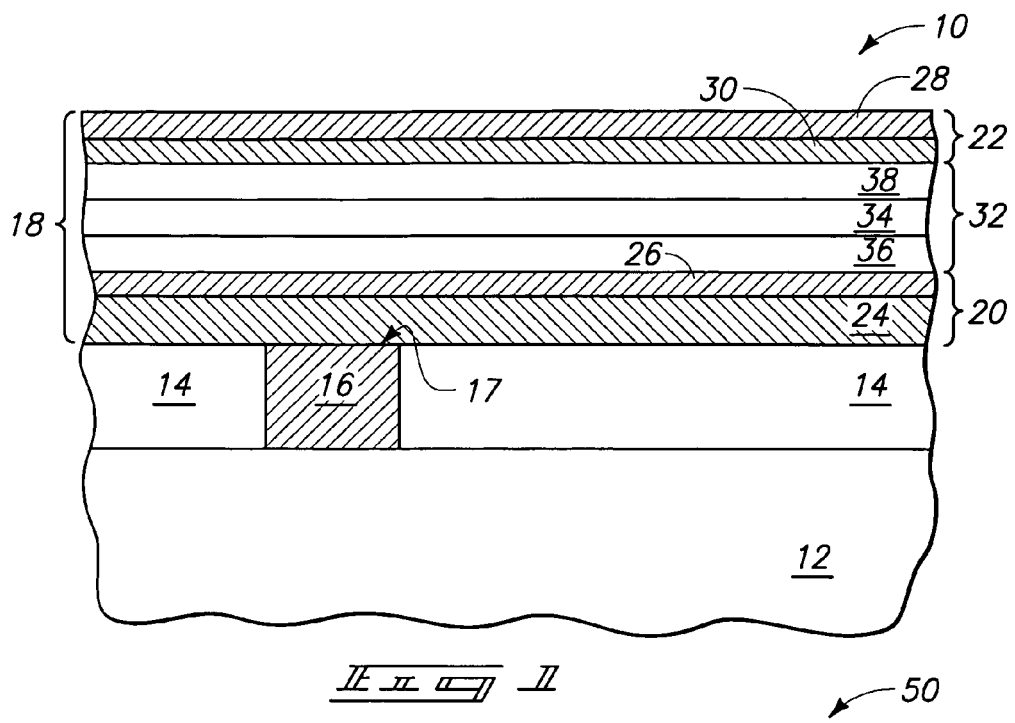
FIG. 1 is a diagrammatic, cross-sectional view of a capacitor construction formed in accordance with an exemplary aspect of the present invention.

This disclosure of the invention is submitted in furtherance of the constitutional purposes of the U.S. Patent Laws "to promote the progress of science and useful arts" (Article 1, Section 8).

The invention includes a recognition that it can be useful to utilize aluminum oxide ($Al_2O_3$) dielectric material as a barrier layer between a capacitor electrode and a high-k dielectric material other than aluminum oxide in applications in which the capacitor electrode comprises titanium and nitrogen. In particular applications, the capacitor electrode can comprise one or both of titanium nitride (TiN) and boron-doped titanium nitride (TiBN). The high-k dielectric material can comprise, for example, one or more of $Ta_2O_5$, $HfO_x$, $ZrO_y$, barium strontium titanate, strontium titanate, and lead zirconate titanate, where x and y are numbers greater than 0. The capacitor constructions can be metal insulator metal (MIM) constructions, and in particular aspects both electrodes of the capacitor constructions can comprise titanium and nitrogen; and both electrodes can separated from the high-k dielectric material by layers of aluminum oxide.

There are several advantages to utilizing a dielectric comprising at least one aluminum oxide portion together with at least one portion that is a high-k dielectric material other than aluminum oxide. It can be preferred that the high-k dielectric material have a dielectric constant greater than aluminum oxide to improve the capacitance per unit area that can be obtained with a capacitor construction of the present invention. The high-k dielectric materials other than aluminum oxide can significantly improve the permittivity of a stack relative to a dielectric utilizing aluminum oxide alone. For instance, crystalline tantalum pentoxide can have permittivity values of from 30 to 100, which is significantly higher than the aluminum oxide permittivity, (typically from about 9 to about 11). The aluminum oxide layers can avoid oxidation of the capacitor electrodes and other problems which would occur if the high-k dielectric material were utilized in the absence of the aluminum oxide layers.

The utilization of electrodes comprising titanium nitride and/or boron-doped titanium nitride can be particularly advantageous in applications of the present invention. Specifically, titanium nitride and/or boron-doped titanium nitride can be readily formed over a diverse range of materials, and further can be conformally formed over the materials. Further, aluminum oxide can be readily conformally formed over layers comprising one or both of TiN and TiBN, which can enable methodology of the present invention to be readily integrated into a diverse range of semiconductor fabrication processes.

An exemplary aspect of the invention is described with reference to a semiconductor construction 10 in FIG. 1. Construction 10 includes a substrate 12 which can comprise, for example, monocrystalline silicon lightly-doped with a p-type background dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An electrically insulative material 14 is formed over substrate 12. Material 14 can comprise any suitable material including, for example, borophosphosilicate glass (BPSG), silicon dioxide, silicon nitride, etc. An opening extends through insulative material 14 to substrate 12, and an electrically conductive pedestal 16 is formed within the opening. Pedestal 16 can comprise any suitable electrically conductive material, including, for example, one or more of conductively-doped silicon, metal, and metal compounds. Pedestal 16 has an upper surface 17 which defines an electrical node.

A capacitor construction 18 is over pedestal 16, and an electrode of the capacitor construction is electrically connected with electrical node 17. Pedestal 16 can be utilized to electrically connect capacitor construction 18 with other circuitry (not shown). The other circuitry can include, for example, a transistor device, and pedestal 16 can be electrically connected with a source/drain region of such transistor device.

The capacitor construction 18 comprises a first capacitor electrode 20 and a second capacitor electrode 22. The first capacitor electrode comprises a first electrically conductive layer 24 which can contain any suitable electrically conductive material, including, for example, metal, various metal compounds, and/or conductively-doped silicon. The first capacitor electrode also comprises a second electrically conductive layer 26 over layer 24. Layer 26 preferably comprises titanium and nitrogen. The layer can, for example, comprise, consist essentially of, or consist of one or both of titanium nitride and boron-doped titanium nitride.

Second capacitor electrode comprises an outermost layer 28 which can contain any suitable electrically conductive material, including, for example, conductively-doped silicon, metal, and/or metal compounds. Second capacitor electrode 22 also comprises an inner electrically conductive layer 30 which preferably contains titanium and nitrogen. In particular aspects, layer 30 can comprise, consist essentially of, or consist of one or both of titanium nitride and boron-doped titanium nitride.

Capacitor construction 18 further comprises a dielectric stack 32 between electrodes 20 and 22. Dielectric stack 32 comprises a layer 34 sandwiched between a pair of layers 36 and 38. Layers 36 and 38 preferably comprise, consist essentially of, or consist of aluminum oxide. Layer 34 preferably comprises, consists essentially of, or consists of a high-k dielectric material other than aluminum oxide, and preferably having a dielectric constant greater than that of aluminum oxide. In particular aspects, layer 34 can comprise one or more materials selected from the group consisting of tantalum pentoxide, hafnium oxide, zirconium oxide, barium strontium titanate, strontium titanate, and lead zirconate titanate.

Construction 10 is an exemplary construction, and it is to be understood that the invention encompasses constructions having various modifications relative to the shown construction 10. For instance, one or both of conductive layers 24 and 28 can be omitted so that one or both of the first and second capacitor electrodes 20 and 22 only comprises a layer containing titanium and nitrogen (i.e., the layers 26 and 30). Also, there can be particular advantages to forming the layer 36 comprising aluminum oxide between high-k dielectric material 34 and conductive layer 26, in that the high-k dielectric is typically formed under oxidizing conditions which would oxidize conductive material 26 in the absence of protective aluminum-oxide-containing material 36. However, since second electrode 22 is formed after formation of high-k dielectric material 34, the second electrode will not be oxidized during formation of dielectric material 34. Accordingly, it can be appropriate in some instances to omit aluminum-oxide-containing material 38, and form second electrode 22 directly against high-k dielectric material 34. However, there can be some applications in which leakage between high-k dielectric material 34 and second electrode 22 is problematic if the second electrode is directly against the high-k dielectric material, and in such applications it can be advantageous to form the aluminum-oxide-containing material 38 as a barrier between the high-k dielectric material 34 and the second electrode 22.

An exemplary method of forming the construction 10 of FIG. 1 is as follows. Initially, a construction comprising substrate 12 having insulative material 14 and pedestal 16 thereover can be formed utilizing conventional methods. The layer 24 of first capacitor electrode 20 can then be formed over an upper surface of pedestal 16 and insulative material 14 utilizing one or more of sputter deposition, chemical vapor deposition and atomic layer deposition, depending on the materials utilized for layer 24. For instance, if layer 24 comprises conductively-doped silicon, the layer can be formed by chemical vapor deposition of silicon followed by an implant of a suitable conductivity-enhancing dopant into the silicon. If layer 24 comprises metal and/or metal compounds, the layer can be formed by physical vapor deposition, chemical vapor deposition and/or atomic layer deposition.

The layer 26 containing titanium and nitrogen can be formed by a deposition method. An exemplary deposition method is a chemical vapor deposition process utilizing a metal source and a nitrogen source as precursors, and a temperature of from about 500° C. to about 800° C. It can be preferred that if layer 24 comprises a silicon-containing surface on which layer 26 is to be formed, the surface be exposed to hydrofluoric acid under suitable conditions to remove native oxide from the surface prior to formation of layer 26. Such can be accomplished by, for example, exposing the surface to a dilute solution of hydrofluoric acid with a 10:1 volumetric ratio of water to 49% hydrofluoric acid. Additionally, and/or alternatively, an upper surface of a silicon-containing material 24 can be subjected to nitridation to increase stack capacitance and decrease leakage. Specifically, the upper surface can be subjected to a high temperature rapid thermal nitridation (RTN) process taking place at a temperature of from about 600° C. to about 1200° C., and more preferably from about 800° C. to about 1000° C., for a time of from about 5 seconds to about 60 seconds, and more preferably from about 20 seconds to about 60 seconds. Alternatively, the nitridation can occur by exposing the upper surface to an $NH_3$ anneal or to an $N_2$ or ammonia ($NH_3$) plasma processing or other source plasma processing to confer a good interface between conductive layer 24 and the subsequently-formed layer 26.

Among the advantages for utilizing titanium nitride for layer 26 is that titanium nitride is an extremely hard material, and almost chemically inert (although it dissolves in hydrofluoric acid), as well as being an excellent conductor. Titanium nitride can also be preferred because it has a high melting point (about 3000° C.), which makes it largely unaffected by high processing temperatures. Further, titanium nitride generally makes excellent ohmic contact with other conductive layers which are directly against the titanium nitride. Boron-doped titanium nitride has advantages similar to those of titanium nitride.

The deposition of layer 26 can occur utilizing ammonia as a nitrogen source; and one or more of titanium tetrachloride ($TiCl_4$), titanium trichloride ($TiCl_3$), and bis (cyclopentadienyl) titanium dichloride ($(C_5H_5)_2TiCl_2$) as a titanium source. Alternatively, layer 26 can be formed utilizing low-temperature chemical vapor deposition with methylhydrazine ($CH_3$) $HNNH_2$) as a nitrogen source; and one or more of titanium tetrachloride, tetrakis diethylamino titanium ($TiN[CH_2)CH_3)_2]_5$ or tetrakis diemethylamino titanium ($Ti[N(CH_3)_2]_4$) as a titanium source.

A titanium nitride material of layer 26 can alternatively be formed by atomic layer deposition. For example, a first species of precursor, which can be a titanium source precursor containing chlorine, such as, for example, titanium tetrachloride or titanium trichloride, is first deposited over the surface of layer 24 as a first monolayer. A second species of precursor, which can be, for example, ammonia, is next applied over the monolayer of the first species of precursor. The second species of precursor reacts with the monolayer of the first species of precursor to form a titanium nitride layer. Successive layers of titanium nitride can be formed over layer 24 by sequentially pulsing the first species (which can also be referred to as a first precursor gas) and the second species (which can also be referred to as a second precursor gas). The sequence of depositing the monolayers of the first and second species of precursors can be repeated cycle after cycle and as often as needed, until a desired thickness is reached for the titanium nitride layer 26. Between each of the precursor gas pulses, a chamber utilized for the atomic layer deposition process can be exhausted, and, if desired, a pulse of purge gas can be injected into the chamber.

If layer 26 comprising boron-doped titanium nitride, such material can have a boron doping concentration of from about 0.01% to about 30% (atomic percentage). Incorporation of boron into a titanium nitride film can be achieved by exposing a titanium nitride film to $B_2H_6$ at a temperature of from about 200° C. to about 600° C., at a pressure of from about 1 Torr to about 1000 Torr, and for a period of time of from about 10 seconds to about 60 minutes. Such can convert the titanium nitride film to a boron-doped titanium material. Alternatively, incorporation of boron into a titanium nitride film can be achieved by exposing the titanium nitride film to $B_2H_6$ and further to ultraviolet (UV) light, at a temperature of from about 200° C. to about 600° C., at a pressure from 1 Torr to about 1000 Torr, and for a period of time of from about 10 seconds to about 60 minutes. Any wavelength in the ultraviolet range can be used for exposing the $B_2H_6$ and furthering incorporating the boron into the titanium nitride material.

Boron-doped titanium nitride can also be formed by a deposition method, such as, for example, a chemical vapor deposition process using a titanium source, a boron source and a nitrogen source as precursors. The deposition can be conducted at a temperature of from about 500° C. to about 800° C., and typically is conducted at a temperature of about 600° C. The boron-doped titanium nitride layer can be formed using a titanium source precursor containing chlorine, such as, for example, titanium tetrachloride, titanium trichloride, bis(cyclopentadienyl)titanium dichloride and/or cyclopentadienyltitanium trichloride. The nitrogen precursor can comprise, for example, ammonia. The boron precursor can comprise, for example, $B_2H_6$.

Regardless of whether layer 26 comprises titanium nitride, boron-doped titanium nitride, or a combination of boron-doped titanium nitride and titanium nitride, the layer will typically be formed to a thickness of from about 25 angstroms to about 250 angstroms, with a typical thickness being from about 25 angstroms to about 100 angstroms.

After formation of titanium nitride and/or boron-doped titanium nitride layer 26, the layer 26 can be subjected to an oxidizing and/or nitridizing ambient to densify the titanium nitride and/or boron-doped titanium nitride. Densification of the material can decrease leakage and increase cell capacitance. The oxidizing and/or nitrogen ambient can also reduce, and in some cases prevent, unwanted diffusion and reactions between material of layer 26 and the material of underlying layer 24. Additionally, the oxidizing and/or nitridizing can reduce, and preferably prevent, chlorine permeation in the layer 26. The presence of chlorine atoms in layer 26 typically occurs as a result of reaction products and materials employed in the chemical vapor deposition processes for formation of the titanium-containing layer.

An exemplary nitridization process comprises, for example, one or more of high temperature rapid thermal nitridation (RTN), remote plasma nitridation (RPN), or in-situ remote radio frequency nitridization. Layer 26 can, for example, be exposed to a nitrogen-containing plasma formed from $N_2$ and $H_2$ within a reaction chamber. An exemplary nitrogen-containing plasma mixture comprises, by volume, from about 10% to about 80% of $N_2$ and from about 20% to about 90% of $H_2$, at a temperature of from about 100° C. to about 800° C., and more preferably of from about 100° C. to about 900° C., for an exposure time of from about 30 seconds to about 60 seconds. The nitrogen-containing plasma mixture can further comprise argon or another inert gas, typically in a percentage of from about 0.01% to about 40%, by volume. Alternatively, a nitrogen-containing plasma formed from $NH_3$ can be employed with or without an inert gas. In yet another aspect of the invention, layer 26 can be subjected to an oxidizing ambient. For example, layer 26 can be subjected to remote plasma oxidation (RPO) using an oxygen or ozone source, with or without ultraviolet light.

Aluminum oxide-containing layer 36 can be formed by, for example, chemical vapor deposition, metal-organic chemical vapor deposition, and/or sputtering. Layer 36 is preferably formed to a thickness of from about 20 angstroms to about 500 angstroms, more preferably from about 25 angstroms to about 100 angstroms, yet more preferably to a thickness of from about 5 angstroms to about 20 angstroms, and in particular applications can be formed to a thickness of from about 5 angstroms to about 10 angstroms.

The $Al_2O_3$ layer 36 can also be formed by atomic layer deposition. In an exemplary process, a first species of aluminum precursor, such as an aluminum source precursor containing chlorine, (for example, aluminum tetrachloride ($AlCl_4$) or aluminum trichloride ($AlCl_3$)) is first deposited over the surface of layer 26. An oxygen precursor, such as, for example, diatomic oxygen ($O_2$) or ozone ($O_3$) is next applied over the monolayer formed from the aluminum-containing precursor. The oxygen species reacts with the monolayer formed from the aluminum-containing precursor to form an aluminum oxide ($Al_2O_3$) layer. Multiple $Al_2O_3$ layers can be sequentially formed over layer 26, and the multiple layers can together constitute layer 36. The multiple layers can be formed by first pulsing the aluminum-comprising species (which can also be referred to as a first precursor gas), and then pulsing the oxygen-containing precursor (which can also be referred to as a second precursor gas) into a reaction chamber to deposit the aluminum oxide layers over layer 26. The sequence of depositing the monolayers of the first and second species of precursors can be repeated cycle after cycle and as often as needed, until a desired thickness is reached for layer 36. Between each of the precursor gas pulses, the interior of a reaction chamber utilized for the atomic layer deposition can be exhausted, and a pulse of purge gas can be provided, if desired.

High-k dielectric material 34 can be formed by any suitable method, including, for example, one or both of chemical vapor deposition and atomic layer deposition. The high-k material is preferably formed to a thickness of from about 50 angstroms to about 100 angstroms.

The layers 30 and 38 of capacitor 18 can be formed utilizing methodology discussed above. Aluminum-oxide-containing layer 38 can be formed utilizing, for example, the processing described above with reference to layer 36. The layer 30 comprising titanium and nitrogen can be formed utilizing, for example, the processing described previously with reference to layer 26.

Layer 28 can be formed over layer 30 utilizing any appropriate process, such as, for example, chemical vapor deposition, atomic layer deposition and/or sputter deposition.

A total thickness of dielectric material 32 of capacitor 18 will preferably be from about 40 angstroms to about 100 angstroms, with a thickness of from about 50 angstroms to about 70 angstroms being typical. Layer 30 can have a thickness approximately the same as that of layer 26, and can be formed to comprise the same chemical composition as layer 26. In other aspects of the invention, layer 30 can be formed to have a different chemical composition than layer 26, and/or can be formed to have a different thickness than layer 26.

Figure 2:
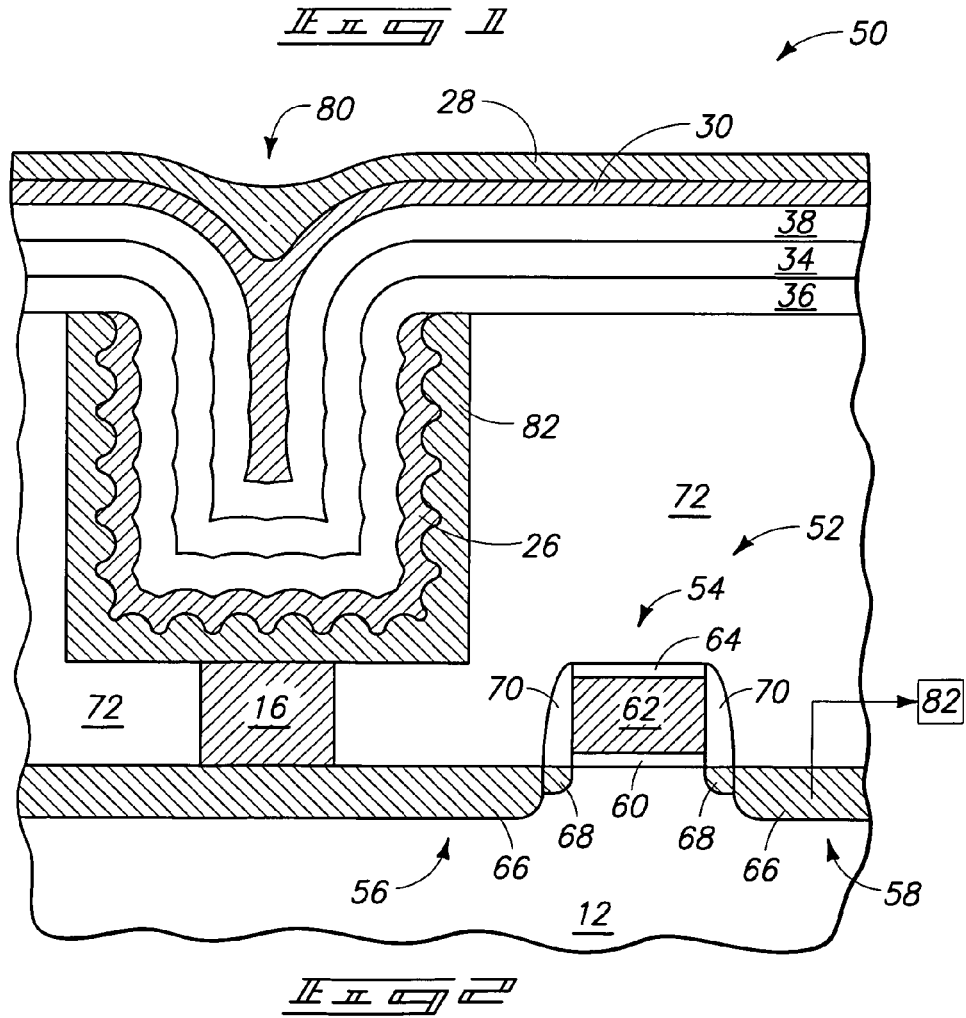
FIG. 2 is a diagrammatic, cross-sectional view of a capacitor construction formed in accordance with another exemplary aspect of the present invention.

Construction 10 of FIG. 1 illustrates one exemplary capacitor construction of the present invention. Another exemplary capacitor construction of the present invention is described with reference to a construction 50 in FIG. 2. In referring to FIG. 2, similar numbering will be utilized as was used above in describing FIG. 1, where appropriate.

Construction 50 comprises a substrate 12 which can, as discussed above with reference to the construction of FIG. 1, comprise a semiconductor substrate, and in particular aspects can comprise monocrystalline silicon lightly-doped with a background p-type dopant.

A transistor device 52 is supported by substrate 12. Transistor device 52 comprises a transistor gate 54 and source/drain regions 56 and 58 on opposing sides of gate 54. Gate 54 can comprise any suitable construction, and is shown comprising an insulative material 60 (which can comprise, for example, silicon dioxide), a conductive material 62 (which can comprise, for example, one or more of conductively-doped silicon, metal and metal compounds), and an insulative cap 64 (which can comprise, for example, one or both of silicon dioxide and silicon nitride).

Source/drain regions 56 and 58 comprise a heavily-doped region 66 and a lightly-doped region 68 inward of the heavily-doped region. Source/drain regions 56 and 58 can be formed by conventional methods.

A pair of sidewall spacers 70 are shown along opposing sidewalls of transistor gate 54. Sidewall spacers 70 can comprise, for example, silicon dioxide and/or silicon nitride, and can be formed by conventional methods.

An insulative material 72 is over substrate 12 and over transistor device 52. Insulative material 72 can comprise any suitable material, including, for example, borophosphosilicate glass (BPSG), silicon dioxide, borosilicate glass, and/or phosphosilicate glass.

A conductive pedestal 16 is within an opening in insulative material 72, and electrically connected with source/drain region 56. Conductive pedestal 16 can comprise the same materials as described above with reference to FIG. 1.

A container-type capacitor 80 is within an opening in insulative material 72, and is electrically connected with pedestal 16. Capacitor 80 includes a rugged layer 82, which can correspond to, for example, hemispherical grain polysilicon. Accordingly, layer 82 can be conductively-doped silicon.

Capacitor 80 further comprises the layers 26, 28, 30, 34, 36 and 38 described previously. Accordingly, the capacitor construction includes a layer 26 comprising titanium and nitrogen, and which can comprise, consist essentially of, or consist of titanium nitride and/or boron-doped titanium nitride. The capacitor construction further includes an aluminum oxide-containing layer 36 over the layer 26, and a high-k dielectric material 34 over the layer 36. The construction further includes a second aluminum oxide-containing layer 38 over high-k dielectric material 34, and a layer 30 comprising titanium and nitrogen over layer 38. Additionally, the shown capacitor construction includes a conductive material 28 over layer 30. Layers 28 and 30 together form one of the capacitor electrodes of capacitor 80, and layers 26 and 82 form the other capacitor electrode of capacitor 80.

The source/drain region 58 is electrically connected to a bitline 82. Such connection can occur before or after formation of capacitor 80. The construction 50 comprising capacitor 80 connected to bitline 82 through access device 52 corresponds to an exemplary DRAM cell that can be formed in accordance with the present invention.

Although the exemplary construction as shown utilizing a container-type capacitor, it is to be understood that methodology of the present invention can be utilized to form other capacitors, such as, for example, stud capacitors.

A circuit device comprising rugged material formed in accordance with methodology of the present invention (such as the above-described DRAM cell) can be utilized in numerous assemblies, including, for example, computer systems and other electronic systems.

FIG. 3 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above, including, for example, the DRAM unit cell described with reference to FIG. 2. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 4. In such block diagram, the addressing circuitry is illustrated as 410 and the read circuitry is illustrated as 412.

In particular aspects of the invention, memory device 408 can correspond to a memory module. For example, single in-line memory modules (SIMMs) and dual in-line memory modules (DIMMs) may be used in the implementation which utilizes the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

FIG. 5 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include one or more DRAM cells in accordance with various aspects of the present invention.

FIG. 6 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals 824 from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a DRAM cell of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A DRAM cell comprising:
an access device; and
a charge storage device electrically coupled to the access device, the charge storage device comprising:

a plurality of discrete conductive layers, the discrete conductive layers comprising titanium nitride and boron-doped titanium nitride;

a dielectric stack over the plurality of the discrete conductive layers, the dielectric stack comprising at least three discrete layers, a first discrete layer of the three comprising aluminum oxide and a second discrete layer of the three comprising high-k dielectric material, the high-k dielectric material comprising a composition other than aluminum oxide; and a first electrode over the dielectric stack and comprising first and second discrete layers, the first discrete layer comprising boron-doped titanium nitride and the second discrete layer comprising conductively-doped silicon.

2. The DRAM cell of claim 1 wherein the composition of the high-k dielectric material comprises $Ta_2O_5$.

3. The DRAM cell of claim 1 wherein the composition of the high-k dielectric material comprises $HfO_x$.

4. The DRAM cell of claim 1 wherein the composition of the high-k dielectric material comprises $ZrO_y$.

5. The DRAM cell of claim 1 wherein the composition of the high-k dielectric material comprises bismuth strontium titanate.

6. The DRAM cell of claim 1 wherein the composition of the high-k dielectric material comprises strontium titanate.

7. The DRAM cell of claim 1 wherein a third discrete layer of the dielectric stack comprises aluminum oxide.

8. The DRAM cell of claim 7 wherein the second discrete layer of the dielectric stack is positioned between the first and the third discrete layers.

9. An electronic system comprising the DRAM cell of claim 1.

10. The DRAM cell of claim 1 wherein the second discrete layer of the high-k dielectric material comprises a dielectric constant greater than a dielectric constant of the first discrete layer of the aluminum oxide.

11. The DRAM cell of claim 1 wherein the second discrete layer of the high-k dielectric material comprises a permittivity value greater than a permittivity value of the first discrete layer of the aluminum oxide.

12. The DRAM cell of claim 1 wherein the second discrete layer of the high-k dielectric material comprises a permittivity value within a range of from about 30 to about 100.

13. A DRAM cell comprising:

an access device; and a charge storage device electrically coupled to the access device, the charge storage device comprising:

a conductive layer comprising a composition other than metal;

a dielectric composition over the conductive layer, the dielectric composition comprising a portion of aluminum oxide and a portion of a high-k dielectric material, the portion of the high-k dielectric material comprising material other than aluminum oxide; and wherein the portion of the aluminum oxide comprises multiple aluminum oxide layers together against each other.

14. The DRAM cell of claim 13 wherein the portion of the high-k dielectric material comprises $Ta_2O_5$.

15. The DRAM cell of claim 13 wherein the portion of the high-k dielectric material comprises $HfO_x$.

16. The DRAM cell of claim 13 wherein the portion of the high-k dielectric material comprises $ZrO_y$.

17. The DRAM cell of claim 13 wherein the portion of the high-k dielectric material comprises bismuth strontium titanate.

18. The DRAM cell of claim 13 wherein the portion of the high-k dielectric material comprises strontium titanate.

19. An electronic system comprising the DRAM cell of claim 13.

20. The DRAM cell of claim 13 wherein the portion of the high-k dielectric material comprises a dielectric constant greater than a dielectric constant of the portion of the aluminum oxide.

21. The DRAM cell of claim 13 wherein the portion of the high-k dielectric material comprises a permittivity value greater than a permittivity value of the portion of the aluminum oxide.

22. The DRAM cell of claim 13 wherein the portion of the high-k dielectric material comprises a permittivity value within a range of from about 30 to about 100.

23. The DRAM cell of claim 13 further comprising another conductive layer over the dielectric composition, the another conductive layer comprising conductively-doped silicon.

24. The DRAM cell of claim 13 further comprising another conductive layer over the dielectric composition, the another conductive layer comprising titanium nitride.

25. The DRAM cell of claim 13 further comprising another conductive layer over the dielectric composition, the another conductive layer consisting essentially of titanium nitride.

26. The DRAM cell of claim 13 further comprising another conductive layer over the dielectric composition, the another conductive layer comprising boron-doped titanium nitride.

27. The DRAM cell of claim 13 further comprising another conductive layer over the dielectric composition, the another conductive layer consisting essentially of boron-doped titanium nitride.

28. The DRAM cell of claim 13 wherein the access device comprises a transistor.

29. A DRAM cell comprising:

a transistor; and a container-type capacitor electrically coupled to the transistor, the capacitor comprising:

a first capacitor electrode comprising a plurality of discrete conductive layers, at least one of the conductive layers comprising an undulating upper surface;

a dielectric material over the first capacitor electrode, the dielectric material comprising at least three discrete layers, the at least three discrete layers comprising a middle discrete layer between two outer discrete layers, the middle discrete layer comprising a composition of high-k dielectric material other than aluminum oxide and tantalum pentoxide;

a second capacitor electrode over the dielectric material; and wherein the composition of the high-k dielectric material comprises bismuth strontium titanate.

30. The DRAM cell of claim 29 wherein the composition of the high-k dielectric material further comprises $HfO_x$.

31. The DRAM cell of claim 29 wherein the composition of the high-k dielectric material further comprises $ZrO_y$.

32. The DRAM cell of claim 29 wherein the composition of the high-k dielectric material further comprises strontium titanate.

33. A DRAM cell comprising:

a transistor; and a capacitor electrically coupled to the transistor, the capacitor comprising:

a first capacitor electrode;

a dielectric material over the first capacitor electrode, the dielectric material comprising an aluminum oxide layer and a high-k dielectric layer, the high-k dielectric layer comprising at least bismuth strontium titanate; and a second capacitor electrode over the dielectric material.

34. The DRAM cell of claim 33 wherein the dielectric material comprises another aluminum oxide layer.

35. The DRAM cell of claim 33 wherein the dielectric material comprises a third dielectric layer, and wherein the first capacitor electrode comprises a plurality of conductive layers.

36. A DRAM cell comprising:
an access device; and
a charge storage device electrically coupled to the access device, the charge storage device comprising:
  a plurality of discrete conductive layers;
  a dielectric stack over the plurality of the discrete conductive layers, the dielectric stack comprising at least three discrete layers, a first discrete layer of the three comprising aluminum oxide and a second discrete layer of the three comprising high-k dielectric material, the high-k dielectric material comprising a composition other than aluminum oxide; and
  wherein the composition of the high-k dielectric material comprises bismuth strontium titanate.

37. A DRAM cell comprising:
an access device; and
a charge storage device electrically coupled to the access device, the charge storage device comprising:
  a plurality of discrete conductive layers, the discrete conductive layers comprising titanium nitride and boron-doped titanium nitride;
  a dielectric stack over the plurality of the discrete conductive layers, the dielectric stack comprising at least three discrete layers, a first discrete layer of the three comprising aluminum oxide and a second discrete layer of the three comprising high-k dielectric material, the high-k dielectric material comprising a composition other than aluminum oxide; and
  wherein the composition of the high-k dielectric material comprises bismuth strontium titanate.

38. A DRAM cell comprising:
a transistor; and
a container-type capacitor electrically coupled to the transistor, the capacitor comprising:
  a first capacitor electrode;
  a dielectric material over the first capacitor electrode, the dielectric material comprising at least three discrete layers, the at least three discrete layers comprising a middle discrete layer between two outer discrete layers, the middle discrete layer comprising a composition of high-k dielectric material other than aluminum oxide and tantalum pentoxide;
  a second capacitor electrode over the dielectric material; and
  wherein the composition of the high-k dielectric material comprises bismuth strontium titanate.

* * * * *